US011822863B2

(12) United States Patent
Phillips et al.

(10) Patent No.: US 11,822,863 B2
(45) Date of Patent: Nov. 21, 2023

(54) MODEL BASED SYSTEM FOR VIRTUAL DEVICE SIMULATION

(71) Applicant: Honeywell International, Inc., Morris Plains, NJ (US)

(72) Inventors: Mark Phillips, Sammamish, WA (US); Sakti Dutta Kunz, Warren, NJ (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 1086 days.

(21) Appl. No.: 16/166,256

(22) Filed: Oct. 22, 2018

(65) Prior Publication Data

US 2020/0125685 A1   Apr. 23, 2020

(51) Int. Cl.
  *G06F 30/20* (2020.01)
  *G06F 3/01* (2006.01)
  *H04W 76/15* (2018.01)

(52) U.S. Cl.
  CPC .............. *G06F 30/20* (2020.01); *G06F 3/011* (2013.01); *H04W 76/15* (2018.02)

(58) Field of Classification Search
  CPC ......... G06F 30/20; G06F 3/011; H04W 76/15
  See application file for complete search history.

(56) References Cited

U.S. PATENT DOCUMENTS

| 9,984,510 B1 * | 5/2018 | Kinstner | G06T 19/006 |
| 2009/0179921 A1 * | 7/2009 | Raghavan | G06F 8/34 |
| | | | 345/689 |
| 2014/0164983 A1 * | 6/2014 | Kawalkar | G06F 3/04886 |
| | | | 715/781 |
| 2016/0239184 A1 * | 8/2016 | Chapman | G06F 9/451 |
| 2016/0283352 A1 * | 9/2016 | Kraus | H04L 41/00 |
| 2016/0291826 A1 * | 10/2016 | Verzano | H04L 41/145 |
| 2017/0048280 A1 * | 2/2017 | Logue | H04L 63/0823 |
| 2018/0130260 A1 * | 5/2018 | Schmirler | G06T 19/006 |

(Continued)

OTHER PUBLICATIONS

Amazon Alexa App (https://www.youtube.com/watch?v=-PUKt9GkcmM Youtube video, "Amazon Alexa App Update 2018—Better Smart Home & Media Control" by Craig's Tech Talk, Oct. 7, 2018). (Year: 2018).*

*Primary Examiner* — Yu Chen
(74) *Attorney, Agent, or Firm* — Stevens & Lee PC; John Maldjian

(57) ABSTRACT

Aspects of the disclosure relate to processing systems using improved model-based techniques for performing virtual device simulation. A computing platform may receive commands directing the launch of a visual model corresponding to a device identifier. The computing platform may send commands directing a database to provide a state machine model corresponding to the visual model. The computing platform may receive the state machine model and subsequently an indication of a virtual interaction with the visual model. Based on the indication, the computing platform may cause a state change of the visual model and may send, to the client device, state change information corresponding to the visual model. The computing platform may receive information verifying simulated operation parameters, and based on the information the computing platform may cause an implementation update to a device, corresponding to the visual model, based on the simulated operation parameters.

20 Claims, 15 Drawing Sheets

(56) References Cited

U.S. PATENT DOCUMENTS

| | | | |
|---|---|---|---|
| 2019/0026930 A1* | 1/2019 | Kritzler | G06F 3/013 |
| 2019/0052683 A1* | 2/2019 | Logue | H04W 12/04 |
| 2019/0068455 A1* | 2/2019 | Randolph | H04W 4/38 |
| 2019/0340819 A1* | 11/2019 | Chandrashekarappa | G06F 9/451 |
| 2019/0357273 A1* | 11/2019 | Schmit | G06F 3/1423 |
| 2020/0012265 A1* | 1/2020 | Thomsen | G06F 3/0481 |
| 2021/0011448 A1* | 1/2021 | Coleman | G05B 19/0428 |

* cited by examiner

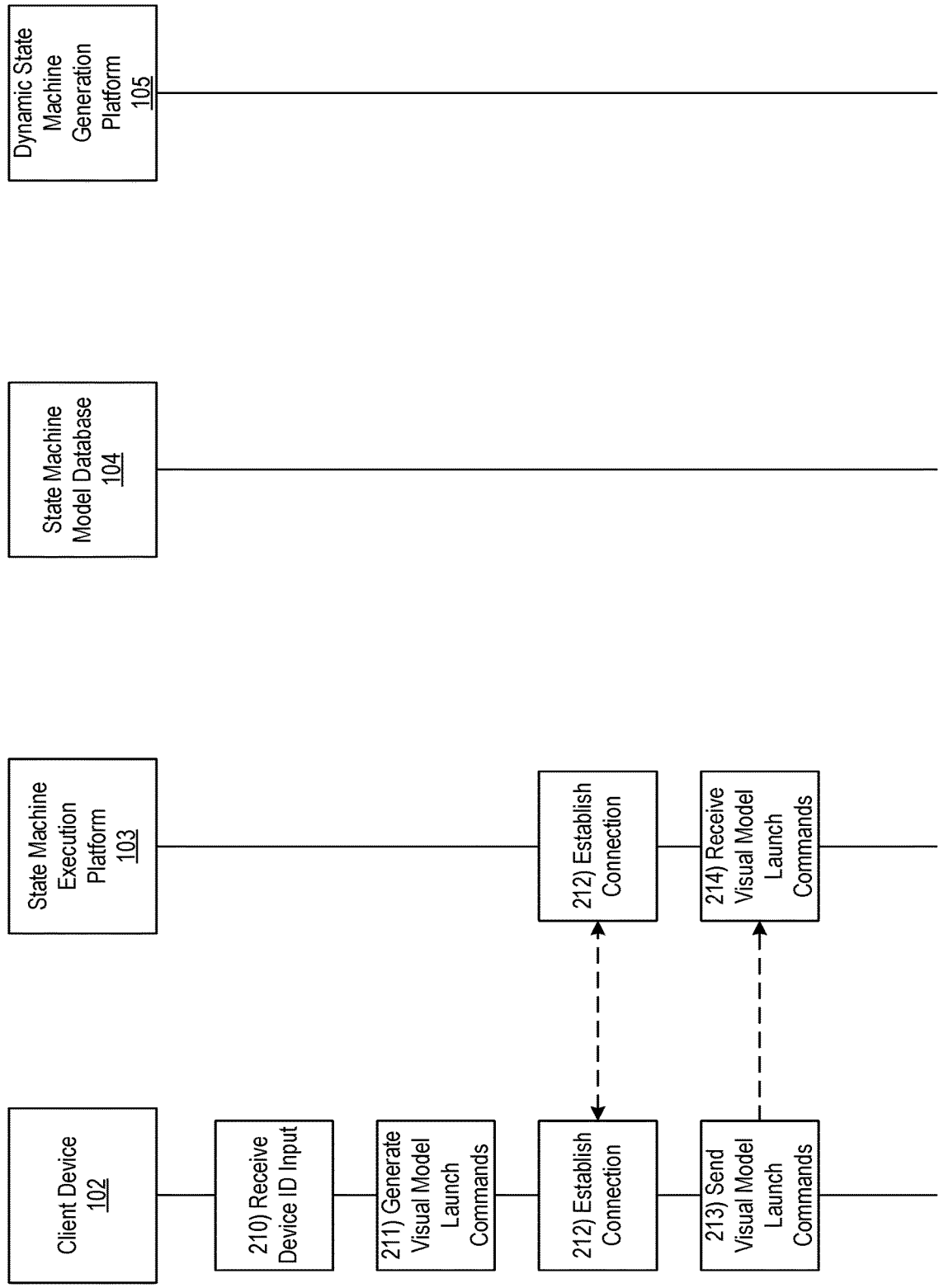

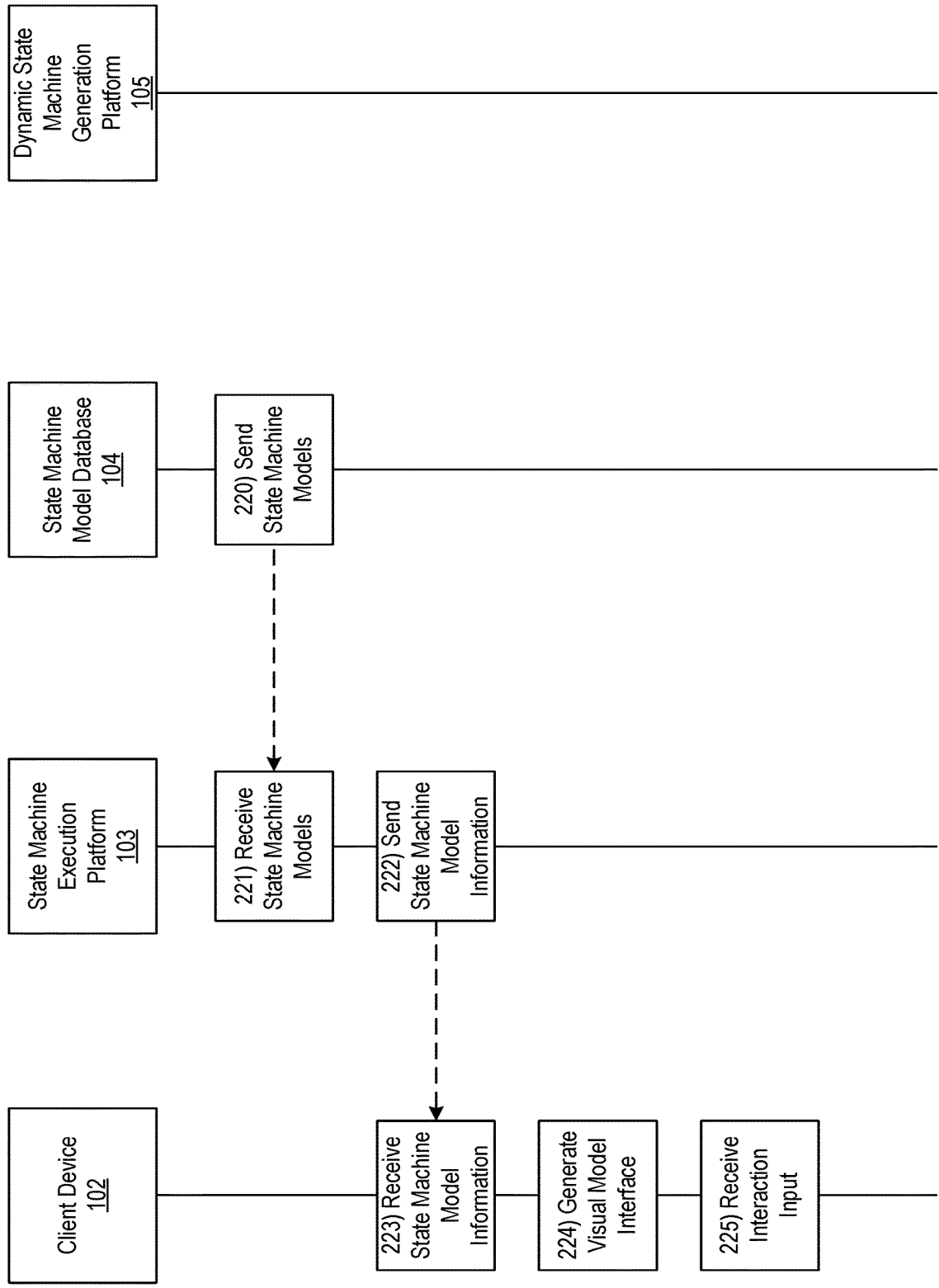

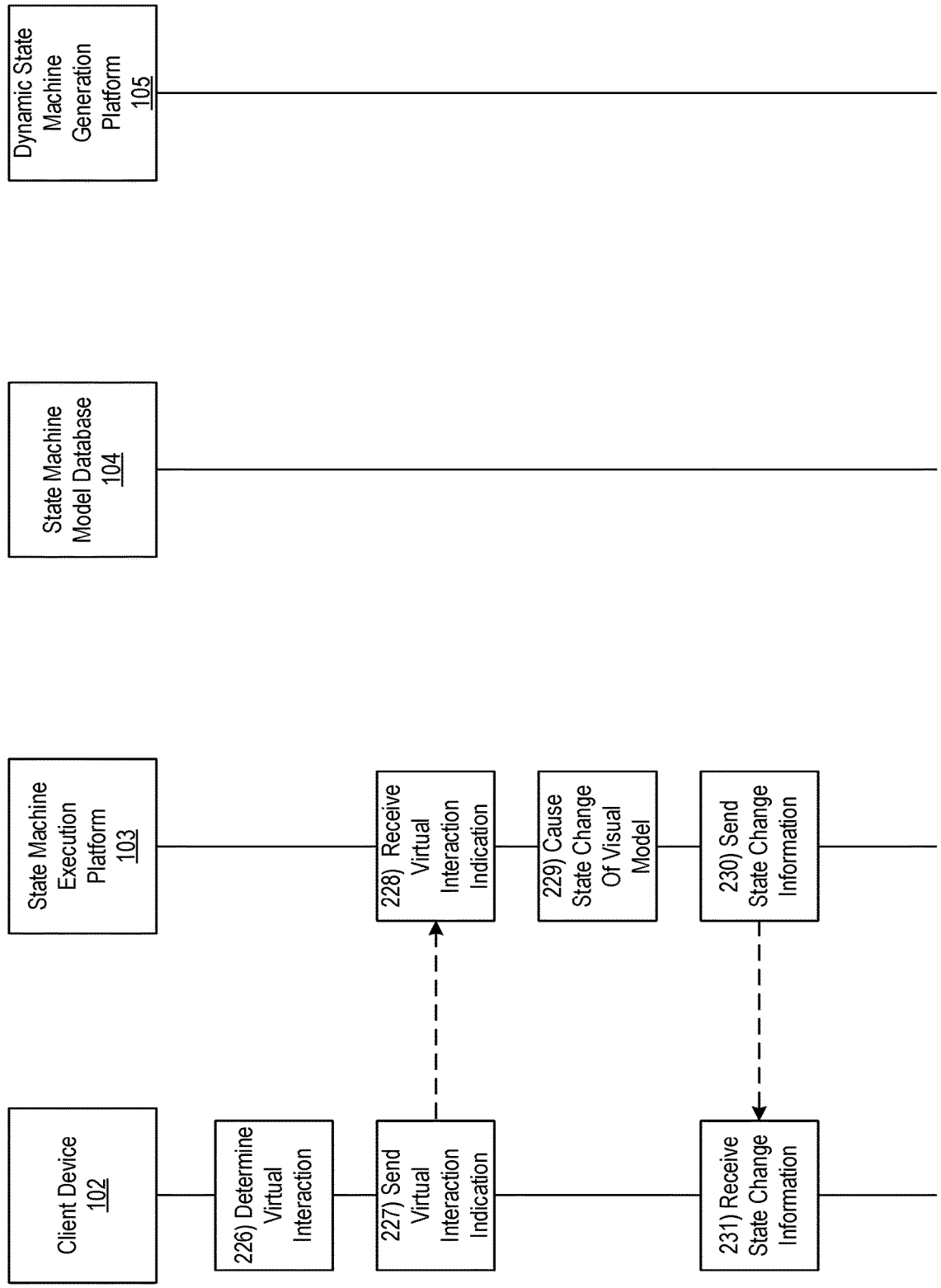

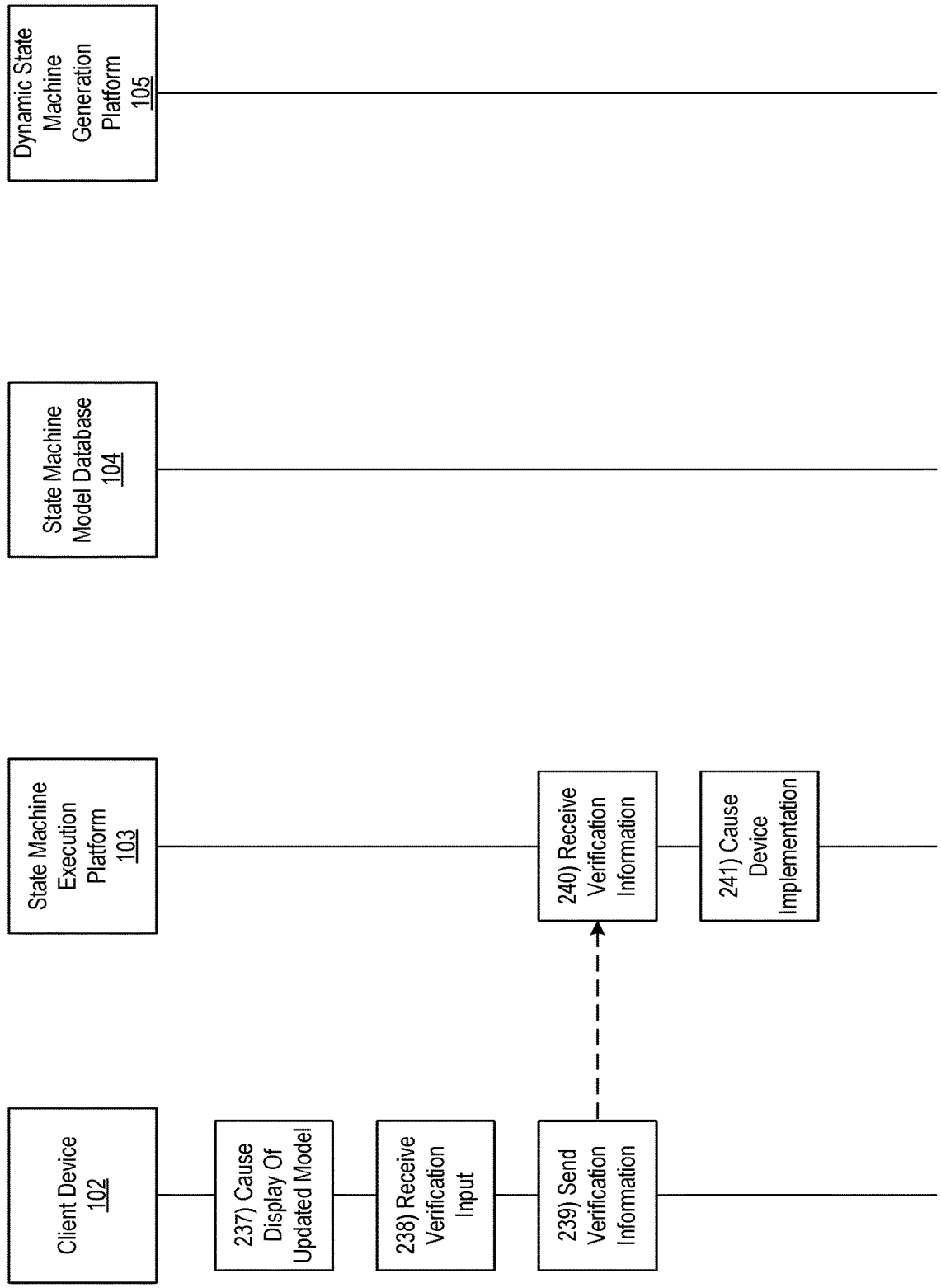

305
Virtual Device Simulation
Please enter a device identifier of the device you would like to simulate:
FIG. 3
405
Current Temperature
72°
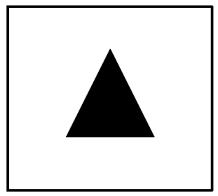 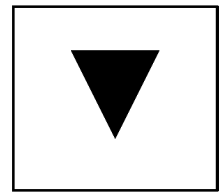
FIG. 4

MODEL BASED SYSTEM FOR VIRTUAL DEVICE SIMULATION

BACKGROUND

Aspects of the disclosure relate to enhanced processing systems for performing virtual device simulation. In particular, one or more aspects of the disclosure relate to virtual device simulation platforms that implement a model-based simulation approach to improve efficiency of system updates and to implement state changes to visual models based on virtual interactions.

Many organizations and individuals rely on virtual device simulation as a tool to gain valuable knowledge and experience without the cost, potential danger, and inconvenience of training on actual devices. Periodically, new devices may be developed and the simulation tool may be updated to include the new devices. It may be important to reduce or eliminate system downtime during these updates. In many instances, however, it may be difficult to minimize such system downtime due to programming delays.

SUMMARY

Aspects of the disclosure provide effective, efficient, scalable, and convenient technical solutions that address and overcome the technical problems associated with implementing and maintaining a virtual device simulation system. For example, some aspects of the disclosure provide techniques that may enable computing platforms to dynamically register state machine models corresponding to new devices to be simulated and to effectively update visual models corresponding to the state machine models in response to virtual interactions.

In accordance with an embodiment of the disclosure, a computing platform comprising at least one processor, a communication interface, and memory storing computing readable instructions may receive one or more commands directing the computing platform to launch a visual model corresponding to a device identifier. The computing platform may send one or more commands directing a state machine model database to deploy a state machine model corresponding to the visual model and may interact with the state machine model corresponding to the visual model. The computing platform may receive, from a client device, an indication of a virtual interaction with the visual model. Based on the indication of the virtual interaction, the computing platform may cause a state change of the visual model and may send, to the client device, state change information corresponding to the visual model.

In some embodiments, the client device may establish a wireless data connection with the computing platform. In some embodiments, the computing platform may determine additional state machine models that are dependent on the state machine model. Using a stored interface model and for each of the additional state machine models that are dependent on the state machine model, the computing platform may determine a state change. The computing platform may send, to the client device, an indication of the state change for each of the additional state machine models that are dependent on the state machine model.

In some embodiments, the computing platform may determine the additional state machine models that are dependent on the state machine model by determining additional device identifiers stored in a dependency model of the state machine model. In some embodiments, the state machine model may be one of a plurality of state machine models stored by the state machine model database, where each state machine model of the plurality of state machine models corresponds to a different device identifier, and where each state machine model of the plurality of state machine models is stored at the state machine model database before receiving one or more commands to launch the visual model corresponding to the device identifier.

In some embodiments, the visual model may be an element of one of an augmented reality environment, mixed-reality environment or a virtual reality environment. In some embodiments, the computing platform may cause the state change of the visual model based on the indication of the virtual interaction by determining that one or more visible attributes of the visual model should be modified in response to the virtual interaction, which may be a gesture input corresponding to the visual model.

These features, along with many others, are discussed in greater detail below.

BRIEF DESCRIPTION OF THE DRAWINGS

The present disclosure is illustrated by way of example and not limited in the accompanying figures in which like reference numerals indicate similar elements and in which:

FIGS. 2A-2H depict an illustrative event sequence for deploying a model based processing system for performing improved virtual device simulation and programming techniques in accordance with one or more example embodiments;

FIGS. 3-5 depict example graphical user interfaces for deploying a model based processing system for performing improved virtual device simulation and programming techniques in accordance with one or more example embodiments.

DETAILED DESCRIPTION

Figure 1A:
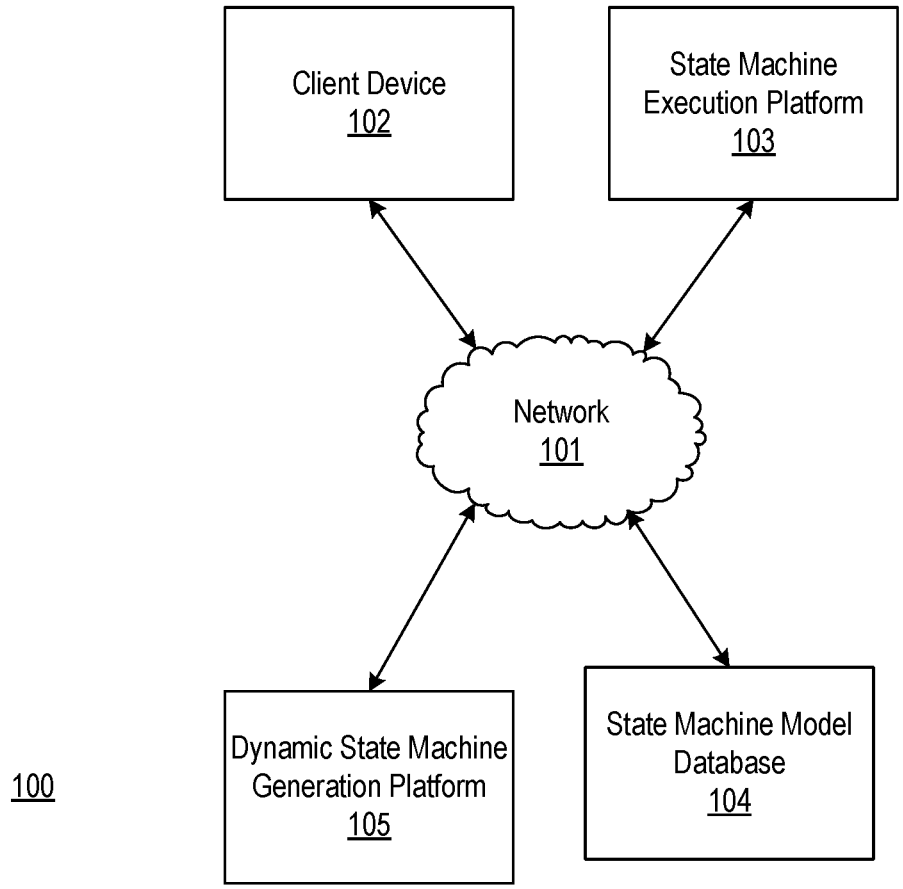
FIGS. 1A-1C depict an illustrative computing environment for deploying a model based processing system for performing improved virtual device simulation and programming techniques in accordance with one or more example embodiments.

In the following description of various illustrative embodiments, reference is made to the accompanying drawings, which form a part hereof, and in which is shown, by way of illustration, various embodiments in which aspects of the disclosure may be practiced. In some instances other embodiments may be utilized, and structural and functional modifications may be made, without departing from the scope of the present disclosure.

It is noted that various connections between elements are discussed in the following description. It is noted that these connections are general and, unless specified otherwise, may be direct or indirect, wired or wireless, and that the specification is not intended to be limiting in this respect.

Within a virtual reality, mixed-reality or augmented reality device simulation environment, in a high availability multi-user scenario such as a cloud service, there is an ever-present need to have new simulated devices, with their associated three-dimensional visual models, loaded into a simulation system without coding changes that may affect availability or performance of the simulation service.

The new simulated devices may be merged into a system catalog and may become available for use by authorized system users. Similarly, it may be possible to retire and remove devices from the system catalog.

When building an augmented reality, mixed-reality or virtual reality system that simulates real world components and behaviors, there is an ever-present need to be able to add new, update or delete existing devices that are part of the overall experience of the applications using the simulation service. This may include components used to simulate behavior and to provide the visual artifacts and user interactions for the device. Such additions, updates, and deletions may be implemented using code changes which may result in downtime to install core updates. This may be both time consuming and expensive to maintain.

The following description proposes a way to reduce both the time and cost to manage these simulated devices through a model-based approach that allows for the dynamic registration and integration of new or updated devices for both the simulation as well as the visual artifacts and user interactions.

A pair of frameworks and a set of models are described herein that may be used to describe a complete virtual device, its visual appearance, and its behaviors and interactions, so that the virtual device may be dynamically loaded into a simulation environment for augmented reality, mixed-reality or virtual reality use without code changes or the resulting downtime for the core simulation environment.

The two separate frameworks may work together, with the models, to dynamically manage the overall experience for a device and its interactions with other devices and users. A client execution framework may manage the visual environment that displays and interacts with the model. It may render the model via a three-dimensional visual model, map user interactions with the three-dimensional model into a set of canonical commands, through the interaction model, and communicate the user's actions to a state machine execution framework via a visual command model. It may also render the visual state changes for the device it receives from a state machine execution framework via the visual state change model.

The state machine execution environment may manage the virtual device simulation and communication with other external devices. It may also execute the state machine for the device via the state machine model. It may map commands received from the client execution framework for the device, via the visual command model, to the canonical command model that the state machine may then use to dynamically alter the behavior of the device. It then may take visual state information, described via the state change model, and deliver it to the client execution framework to potentially alter the visual appearance of the rendered device. Each device may also define a set of devices that it may have a dependency on for correct operation, via a dependency model, as well as defining how it interacts with those models via an interface model.

This model driven approach may include the following models (among others): a three dimensional visual model (visual representation of the device), a visual interaction model (identifies specific visual elements and the set of gestures they can accept (what a user may do to the visual model)), a visual command model (associates visual elements with known commands that may affect the state machine behavior), a visual state change model (associates changes caused by the state machine with the respective visual elements), a state machine model (defines the behavior of the device (using AsmL, Spec#, C#, C++, Java or the like)), a state machine command model (defines the set of known commands that the state machine can accept and binds them to specific behaviors), a state change model (a set of data used by the visual elements to represent the current device state), a state machine interface model (defines interactions the device may have with other virtual devices), and a state machine dependency mode (a set of virtual devices that the device may have a dependency on and its interaction with those models).

Figure 1B:
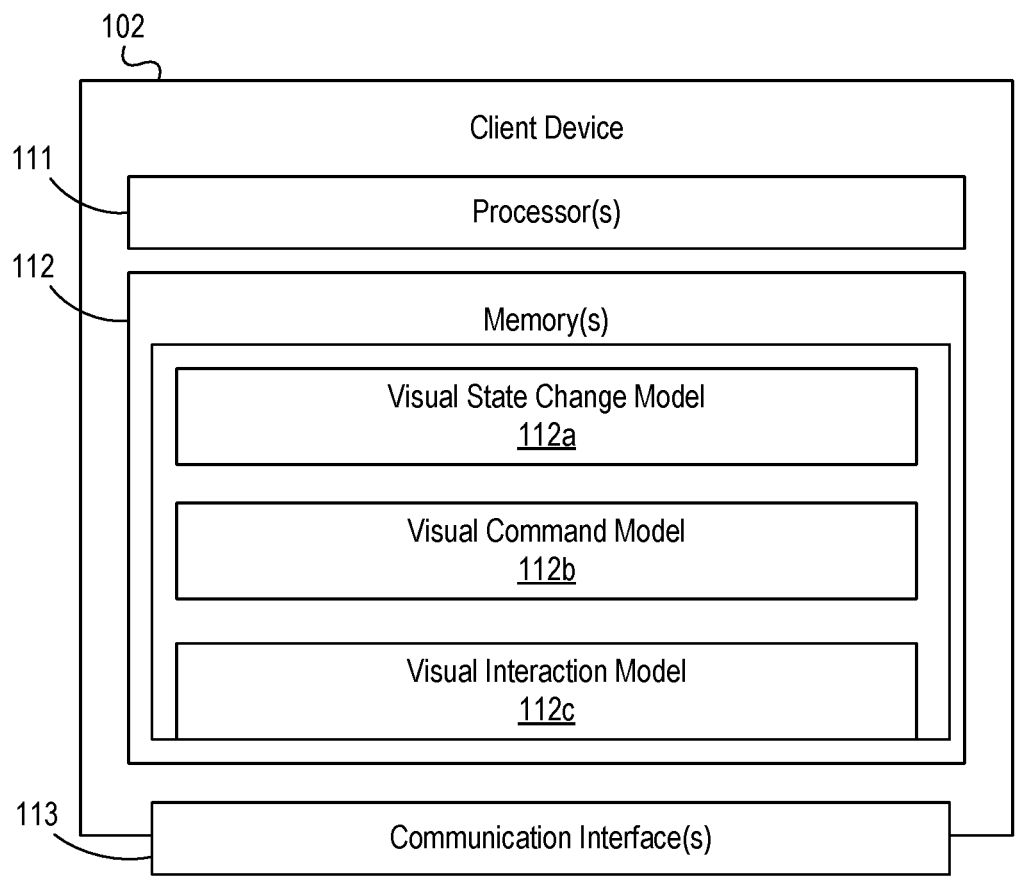
Figure 1C:
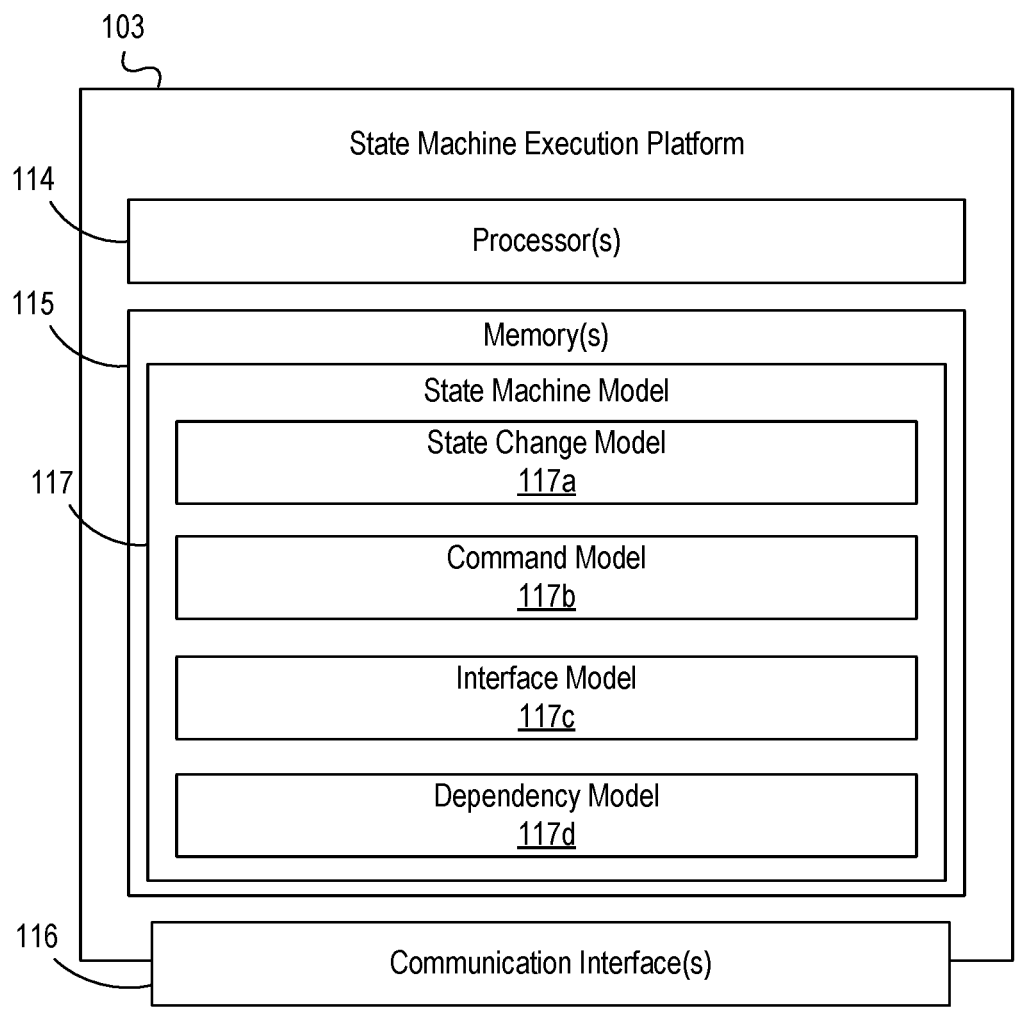

FIGS. 1A-1C depict an illustrative computing environment for deploying a model based processing system for performing improved virtual device simulation and programming in accordance with one or more example embodiments. Referring to FIG. 1A, computing environment 100 may include one or more computer systems. For example, computing environment 100 may include a client device 102, a state machine execution platform 103, a state machine model database 104, and a dynamic state machine generation platform 105.

Client device 102 may be a computer system that includes one or more computing devices and/or other computer components (e.g., processors, memories, communication interfaces). In addition, client device 102 may be configured to receive requests (e.g., requests to cause display and to simulate devices such as hardware, appliances, electronics, and the like.) In some instances, the client device 102 may be a virtual reality (VR) headset, mixed-reality headset, augmented reality (AR) glasses, and the like. In some instances, the client device 102 may also include various input devices such as controllers, sensors, hands, and the like that may be capable of receiving input.

In addition, and as illustrated in greater detail below, client device 102 may be configured to generate, host, transmit, and/or otherwise provide one or more virtual reality environments, mixed-reality environment or augmented reality environments, and/or other graphical user interfaces (which may, e.g., cause one or more other computer systems to display and/or otherwise present the one or more virtual reality environments, mixed-reality environments augmented reality environments, and/or other graphical user interfaces). In some instances, the virtual reality environments, mixed-reality environment or augmented reality environments, and/or other graphical user interfaces generated by client device 102 may be associated with an internal portal provided by an organization, such an internal device simulation tool corresponding to various devices manufactured or used by the organization. Such a portal may, for instance, provide employees of the organization with the ability to test functionality and to troubleshoot repairs with the various devices and/or may provide employees of the organization with menus, controls, and/or other options to execute various actions with regard to the various devices.

As illustrated in greater detail below, state machine execution platform 103 may include one or more computing devices configured to perform one or more of the functions described herein. For example, state machine execution platform 103 may include one or more computers (e.g., laptop computers, desktop computers, servers, server blades, or the like). In one or more examples, the state machine execution platform 103 may host one or more state machine models that may be used to simulate one or more devices in a virtual environment.

State machine model database 104 may include one or more computing devices configured to perform one or more of the functions described herein. For example, state machine model database 104 may include one or more computers (e.g., laptop computers, desktop computers, servers, server blades, or the like). In addition, state machine model database 104 may be configured to receive and store state machine models each corresponding to a device in a virtual environment. The state machine model database 104 may be configured to receive the state machine models from a dynamic state machine generation platform 105, and may be configured to provide the state machine models to the state machine execution platform 103 upon request.

Dynamic state machine generation platform 105 may include one or more computing devices and/or other computer components (e.g., processors, memories, communication interfaces). The dynamic state machine generation platform 105 may include one or more computers (e.g., laptop computers, desktop computers, mobile devices, or the like), and may be configured to receive user input corresponding to state machine model generation commands and information. In addition, and as illustrated in greater detail below, dynamic state machine generation platform 105 may be configured to generate, host, transmit, and/or otherwise provide one or more state machine models each corresponding to a virtual device (which may, e.g., cause one or more other computer systems to display and/or otherwise present one or more virtual environments and/or other graphical user interfaces corresponding to the state machine models). In some instances, the virtual environments and/or other graphical user interfaces generated by dynamic state machine generation platform 105 may be associated with an internal portal provided by an organization, such an internal device simulation tool corresponding to various devices manufactured by the organization. Such a portal may, for instance, provide employees of the organization with the ability to test functionality and to troubleshoot repairs with the various devices and/or may provide employees of the organization with menus, controls, and/or other options to execute various actions with regard to the various devices.

Computing environment 100 also may include one or more networks, which may interconnect client device 102, state machine execution platform 103, state machine model database 104, and dynamic state machine generation platform 105. For example, computing environment 100 may include a network 101 (which may interconnect, e.g., client device 102, state machine execution platform 103, state machine model database, 104, and dynamic state machine generation platform 105).

In one or more arrangements, client device 102, state machine execution platform 103, state machine model database 104, dynamic state machine generation platform 105, and/or the other systems included in computing environment 100 may be any type of computing device capable of receiving a user interface, receiving input via the user interface, and communicating the received input to one or more other computing devices. For example, client device 102, state machine execution platform 103, state machine model database 104, dynamic state machine generation platform 105, and/or the other systems included in computing environment 100 may, in some instances, be and/or include server computers, desktop computers, laptop computers, tablet computers, smart phones, or the like that may include one or more processors, memories, communication interfaces, storage devices, and/or other components. As noted above, and as illustrated in greater detail below, any and/or all of client device 102, state machine execution platform 103, state machine model database 104, and dynamic state machine generation platform 105 may, in some instances, be special-purpose computing devices configured to perform specific functions.

Referring to FIG. 1B, client device 102 may include one or more processors 111, memory 112, and communication interface 113. A data bus may interconnect processor 111, memory 112, and communication interface 113. Communication interface 113 may be a network interface configured to support communication between client device 102 and one or more networks (e.g., network 101, or the like). Memory 112 may include one or more program modules having instructions that, when executed by processor 111, cause client device 102 to perform one or more functions described herein, and/or one or more databases that may store and/or otherwise maintain information that may be used by such program modules and/or processor 111. In some instances, the one or more program modules and/or databases may be stored by and/or maintained in different memory units of client device 102 and/or by different computing devices that may form and/or otherwise make up client device 102. As examples of such program modules, memory 112 may have, store, and/or include a visual state change model 112a, a visual command model 112b, and/or a visual interaction model 112c. Visual state change model 112a may have instructions that direct and/or cause the client device 102 to cause an update to a visual model based on a state change of a corresponding state machine model at the state machine execution platform 103. Visual command model 112b may have instructions that direct and/or cause the client device 102 to direct the state machine execution platform 103 to update a state of the visual model displayed by the client device 102 in response to a virtual interaction. Visual interaction model 112c may store information used by the client device 102 to determine a correlation between a gesture input and the virtual interaction.

Referring to FIG. 1C, state machine execution platform 103 may include one or more processors 114, memory 115, and communication interface 116. A data bus may interconnect processor 114, memory 115, and communication interface 116. Communication interface 116 may be a network interface configured to support communication between state machine execution platform 103 and one or more networks (e.g., network 101, or the like). Memory 115 may include one or more program modules having instructions that, when executed by processor 114, cause state machine execution platform 103 to perform one or more functions described herein and/or one or more databases that may store and/or otherwise maintain information that may be used by such program modules and/or processor 114. In some instances, the one or more program modules and/or databases may be stored by and/or maintained in different memory units of state machine execution platform 103 and/or by different computing devices that may form and/or otherwise make up state machine execution platform 103. As examples of such program modules, memory 115 may have, store, and/or include a state machine model 117, a state change model 117a, a command model 117b, an interface model 117c, and a dependency model 117d. State machine execution platform 103 may include one or more state machine models each corresponding to a different device to be modeled. The state machine model 117 may be configured to receive indications of virtual interactions with a visual model corresponding to the state machine model 117 and to determine state changes of the visual model in response. The state machine model 117 may also maintain a list of other devices that may depend on the device corresponding to the state machine model, and how those other devices may interact with the device corresponding to the state machine model. State change model 117a may have instructions that direct and/or cause state machine execution platform 103 to determine whether a visual appearance of a virtual model should be updated in response to a virtual interaction at the client device 102. Command model 117b may be configured to receive the indication of the virtual interaction from the client device 102. Interface model 117c may be configured to store information used by state machine execution platform 103 in determining how different visual models interact with each other at the client device 102. Dependency model 117d may be configured to store information used by the interface model 115a and the state machine execution platform 103 to determine additional devices that are configured to be dependent on the device corresponding to each state machine model.

Figure 2A:
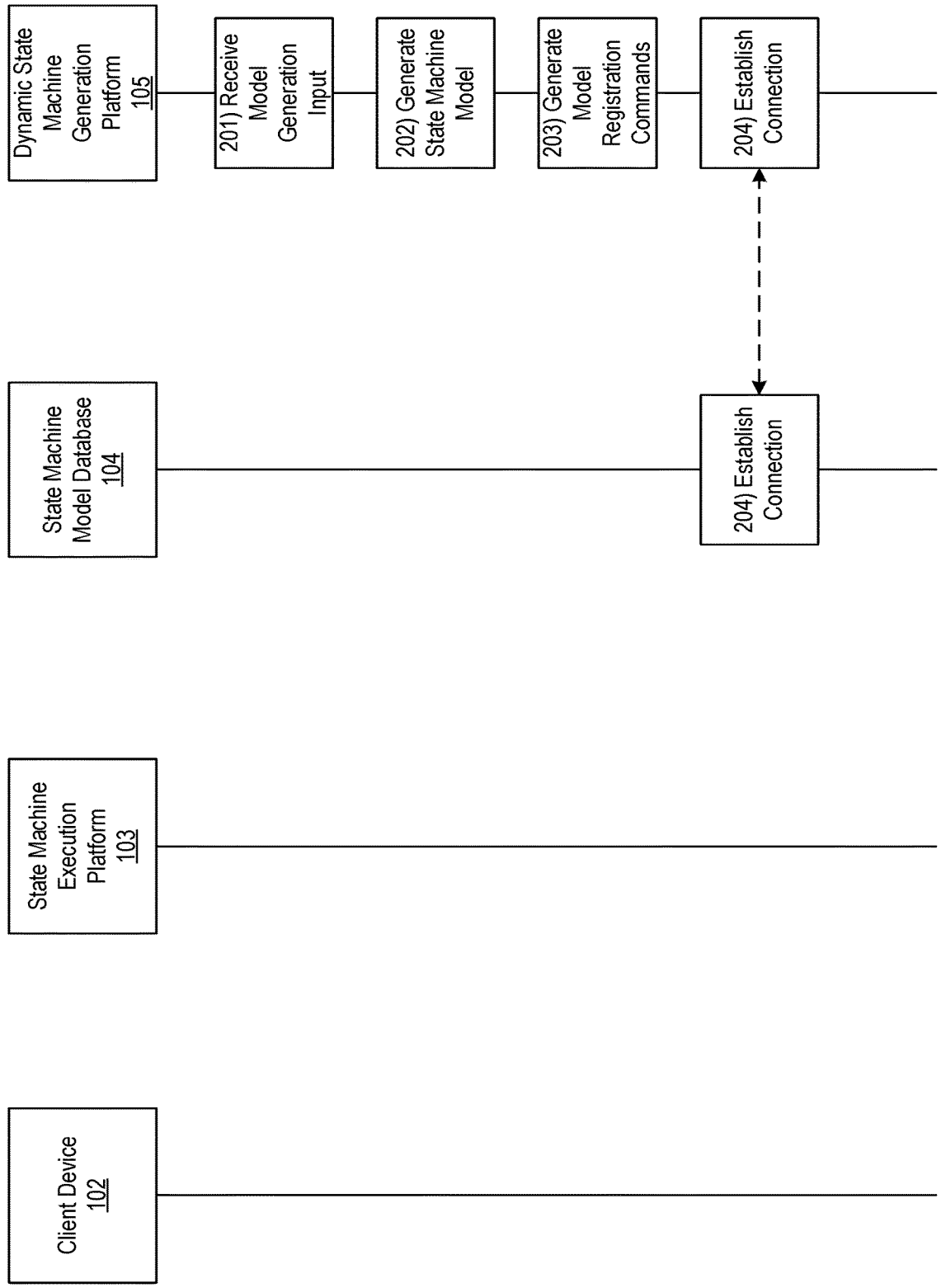

FIGS. 2A-2H depict an illustrative event sequence for deploying a model based processing system for performing improved virtual device simulation and programming techniques in accordance with one or more example embodiments. Referring to FIG. 2A, at step 201, dynamic state machine generation platform 105 may receive a state machine model generation input from a programmer. In receiving the state machine model generation input, the dynamic state machine generation platform 105 may receive a user input corresponding to a markup language description of a device to be modeled. In one or more examples, this user input may be hypertext markup language (HTML) code, assembly language code, spec sharp (Spec#) language code or the like that may be used to generate a model of the device. For example, the device may be an appliance, an electronic device, or the like manufactured by an organization. In other examples, the device may be a component of a larger device (e.g., a valve, switch, pipe, circuit, or the like). Employees of the organization may provide the state machine model generation input to the dynamic state machine generation platform 105 for the purpose of simulating and testing the device using a virtual environment. Clients of the organization may provide the state machine model generation input to the dynamic state machine generation platform 105 while setting up or using the device.

At step 202, the dynamic state machine generation platform 105 may generate a state machine model, such as state change model 117a, in response to the model generation input. For example, the dynamic state machine generation platform 105 may generate a state machine model that may be used to generate a three dimensional visual model of a device at a client device, such as client device 102. In one or more examples, the dynamic state machine generation platform 105 may have received multiple model generation inputs at step 201. In these examples, the dynamic state machine generation platform 105 may generate a state machine model corresponding to each model generation input. In generating the state machine model 117, the dynamic state machine generation platform 105 may generate a model to cause and manage display of the three dimensional visual model (e.g., a virtual reality model, mixed-reality model, augmented reality model, or the like). For example, in generating the state machine model, the dynamic state machine generation model may generate a state change model, a command model, an interface model, and/or a dependency model (e.g., state change model 117a, command model 117b, interface model 117c, and dependency model 117d respectively). By generating these various models within the state machine model 117, the dynamic state machine generation platform may cause the visual model at the client device 102 to update based on virtual interactions. For example, these models may generate information that may be communicated to the client device 102 and ultimately used by the client device 102 to cause updates to the visual model in response to the virtual interactions.

At step 203, the dynamic state machine generation platform 105 may generate one or more commands directing a state machine model database, such as state machine model database 104, to register the state machine models generated at step 202. For example, the dynamic state machine generation platform 105 may generate one or more commands directing the state machine model database 104 to store the state machine models and to index the state machine models based on a device identifier corresponding to the device associated with each state machine model (e.g., serial number, part number, or the like).

At step 204, the dynamic state machine generation platform 105 may establish a connection with the state machine model database 104. For example, the dynamic state machine generation platform 105 may establish a first wireless data connection with the state machine model database 104 to link the dynamic state machine generation platform 105 to the state machine model database 104. In one or more instances, the connection might not be a direct connection between the dynamic state machine generation platform 105 and the state machine model database 104. In one or more instances, after initially establishing the connection with the state machine model database 104, the dynamic state machine generation platform 105 might not subsequently repeat this step.

Figure 2B:
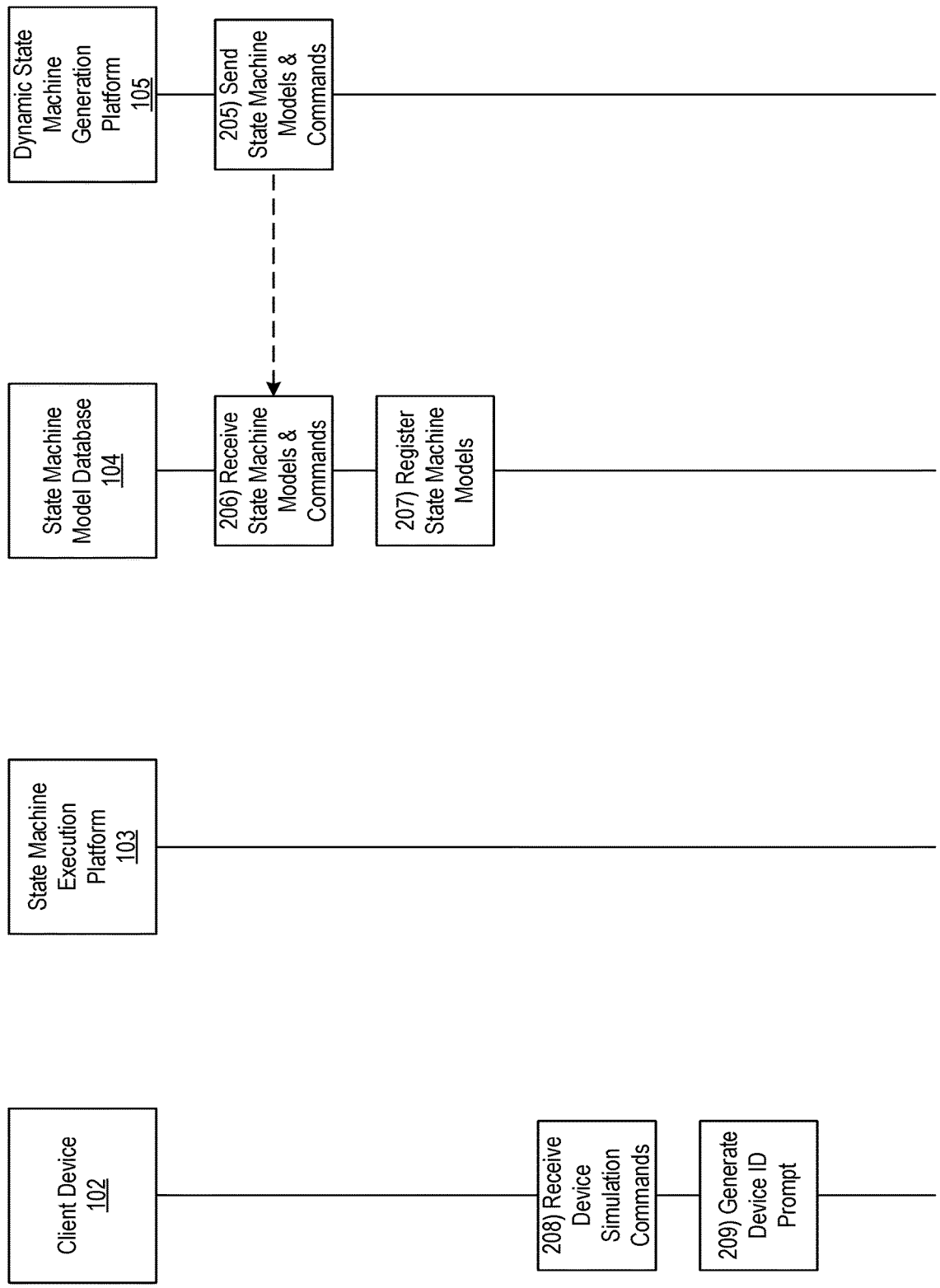

Referring to FIG. 2B, at step 205, the dynamic state machine generation platform 105 may send the state machine models generated at step 202 and the one or more commands directing the state machine model database 104 to register the state machine models. For example, the dynamic state machine generation platform 105 may send, while the first wireless data connection is established, the state machine models and the one or more commands directing the state machine model database 104 to register the state machine models.

At step 206, the state machine model database 104 may receive the state machine models and the one or more commands directing the state machine model database 104 to register the state machine models. For example, the state machine model database 104 may receive the state machine models and the one or more commands while the first wireless data connection is established.

At step 207, the state machine model database 104 may register the state machine models received at step 206. For example, the state machine model database 104 may store each state machine model and may index the state machine models based on a device identifier corresponding to each machine model. In doing so, the state machine model database 104 may determine and maintain a stored correlation between device identifiers and their responsive state machine models.

Although steps 201-207 are shown in a particular order with regard to the rest of the event sequence depicted in FIGS. 2A-2H, it should be understood that dynamic state machine generation platform 105 and state machine model database 104 may continue to generate and register state machine models throughout and at any time during the event sequence depicted in FIGS. 2A-2H. For example, the generation and registration of state machine models may be performed before, after, or in parallel with one or more other steps or processes described herein. In one or more examples, client device 102 might not experience simulation downtime as state machine models are generated and registered.

At step 208, client device 102 may receive one or more commands directing the client device 102 to cause simulation of one or more devices. For example, the client device 102 may receive a request to enter a virtual environment where a user may interact with visual models of the one or more simulated devices.

At step 209, the client device 102 may generate a device identifier prompt. For example, the client device 102 may generate a user interface requesting user input corresponding to one or more devices for which visual models should be added to the virtual environment. In causing display of the device identifier prompt, client device 102 may cause display of a graphical user interface that may include one or more features similar to those depicted in graphical user interface 305, which is illustrated in FIG. 3. As seen in FIG. 3, graphical user interface 305 may include a text box in which user input corresponding to a device identifier may be received by the user device. The text box may provide suggestions for potential device identifiers (e.g., auto-completion, most popular devices, most recent devices, devices frequently used together with one or more already-entered devices, or the like), which may be generated based on a user input of one or more characters. In one or more examples, after the client device 102 receives the device identifier, the client device 102 may provide an indication acknowledging user entry of the device identifier. Then, the client device 102 may generate a new user interface that may be similar to graphical user interface 305. The new user interface may include a subsequent device identifier prompt. For example, the new user interface may prompt the user to enter an additional device identifier corresponding to a second device for which a visual model should be added to the virtual environment. The new user interface may include a list of device identifiers that the user has already entered, to help the user remember the device identifiers that the user has already entered. The client device 102 may continue to prompt for device identifiers until a determination is made that additional visual models will not be requested. In one or more examples, the client device 102 may receive user input indicating that the user is finished entering device identifiers. In one or more examples, the client device 102 may determine that the additional visual models will not be requested by determining that a predetermined period of time has elapsed since receiving a user input corresponding to a device identifier.

Referring to FIG. 2C, at step 210, the client device 102 may receive a device identifier input (e.g., as described above in connection with FIG. 3). For example, in receiving the device identifier input, the client device 102 may receive a serial number, model number, description, name, or the like corresponding to a device for which a visual model should be added to the virtual environment.

At step 211, the client device 102 may generate one or more commands directing the state machine execution platform 103 to launch one or more visual models based on the device identifier inputs received at step 210. For example, the client device 102 may generate one or more commands directing the state machine execution platform 103 to launch one or more state machine models, each corresponding to one of the one or more visual models identified by the device identifier inputs. In one or more examples, the one or more state machine models may correspond to state machine models generated by the dynamic state machine generation platform 105 at step 202 and subsequently stored at the state machine model database 104. In these examples, the one or more commands directing the state machine execution platform 103 to launch the one or more visual models based on the device identifier inputs may be commands directing the state machine execution platform 103 to request and load the one or more visual models from the state machine model database 104.

At step 212, the client device 102 may establish a connection with state machine execution platform 103. For example, the client device 102 may establish a second wireless data connection with the state machine execution platform 103. Although step 212 depicts establishing the connection between the state machine execution platform 103 and the client device 102 after generating the one or more commands directing the state machine execution platform 103 to launch the one or more visual models based on the device identifier inputs received at step 210, it should be understood that the connection between the state machine execution platform 103 and the client device 102 may also be established prior to generating the one or more commands directing the state machine execution platform 103 to launch the one or more visual models based on the device identifier inputs. In one or more instances, the connection might not be a direct connection between the state machine execution platform 103 and the client device 102.

At step 213, the client device 102 may send one or more commands directing the state machine execution platform 103 to launch the one or more visual models. For example, the client device 102 may send the one or more commands, while the second wireless data connection is established and via the communication interface 113, directing the state machine execution platform 103 to launch the one or more visual models.

At step 214, state machine execution platform 103 may receive one or more commands directing the state machine execution platform 103 to launch one or more visual models. For example, the state machine execution platform 103 may receive one or more commands while the second wireless data connection is established and via the communication interface 116.

Figure 2D:
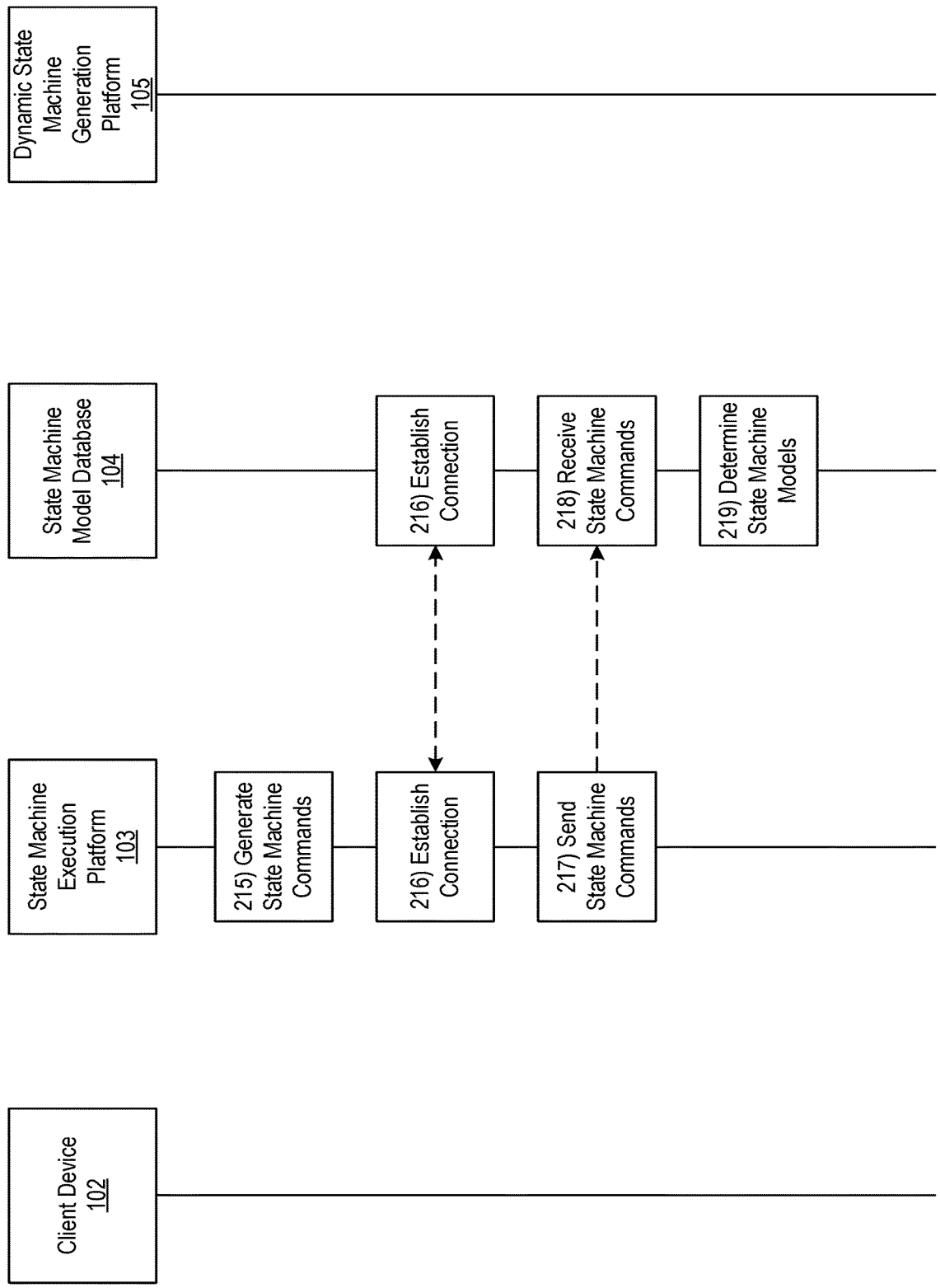

Referring to FIG. 2D, at step 215, the state machine execution platform 103 may generate one or more commands directing the state machine model database 104 to send one or more state machine models, corresponding to the one or more visual models requested by the client device 102, to the state machine execution platform 103. In one or more examples, in generating one or more commands directing the state machine model database 104 to send the one or more state machine models, the state machine execution platform may include the device identifier inputs received by the client device 102 (e.g., as described in connection with FIG. 3 and steps 209-210).

At step 216, state machine execution platform 103 may establish a connection with the state machine model database 104. For example, the state machine execution platform 103 may establish a third wireless data connection with the state machine model database 104. In one or more instances, the connection might not be a direct connection between the state machine execution platform 103 and the state machine model database 104.

At step 217, the state machine execution platform 103 may send, to the state machine model database 104, one or more commands directing the state machine model database 104 to send one or more state machine models. For example, the state machine execution platform 103 may send, while the third wireless data connection is established and via the communication interface 116, one or more commands directing the state machine model database 104 to send one or more state machine models.

At step 218, the state machine model database 104 may receive one or more commands directing the state machine model database 104 to send one or more state machine models. For example, the state machine model database 104 may receive one or more commands while the third wireless data connection is established.

At step 219, the state machine model database 104 may determine one or more state machine models requested by the state machine execution platform 103 at step 217. For example, based on one or more commands directing the state machine model database 104 to send one or more state machine models received from the state machine execution platform 103, the state machine model database 104 may determine a device identifier corresponding to the devices associated with each of one or more state machine models. In one or more embodiments, determining the device identifier may be based on the device identifier(s) received in step 210. Using the device identifiers, the state machine model database 104 may determine the appropriate state machine models for each device for which a visual model is to be included in a virtual environment displayed via the client device 102. For example, based on the registration of the state machine models at step 207, the state machine model database 104 may have a stored correlation between device identifiers and their responsive state machine models. As an example, the state machine model database 104 may have a stored correlation between an identifier for a particular thermostat model and a state machine model corresponding to the particular thermostat model. In another example, the state machine model database 104 may store a correlation for a component of a larger device (e.g., a particular valve, sensor, pipe, circuit, switch, or the like of a larger device).

At step 220, the state machine model database 104 may send one or more state machine models, determined at step 219, to the state machine execution platform. For example, the state machine model database 104 may send, while the third wireless data connection is established, one or more state machine models.

Referring to FIG. 2E, at step 221, the state machine execution platform 103 may receive one or more state machine models, sent at step 220. For example, the state machine execution platform 103 may receive, while the third wireless data connection is established and via the communication interface 116, one or more state machine models.

At step 222, the state machine execution platform 103 may send state machine model information to the client device 102. For example, the state machine execution platform 103 may send the state machine model information while the second wireless data connection is established and via the communication interface 116. In one or more examples, in sending the state machine model information to the client device 102, the state machine execution platform 103 may send information that the client device 102 may use to establish a client execution framework that may interface with the one or more state machine models.

At step 223, the client device 102 may receive the state machine model information sent at step 222. For example, the client device 102 may receive the state machine model information while the second wireless data connection is established and via the communication interface 113. In receiving the state machine model information, the client device 102 may receive a client execution framework that may interface with one or more state machine models. In receiving each client execution framework, the client device 102 may receive a visual state change model, a visual command model, and a visual interaction model (e.g., visual state change model 112a, visual command model 112b, and visual interaction model 112c respectively) that may be used to cause visual updates to a visual model based on virtual interactions. In receiving the visual state change model 112a, the client device 102 may receive a model that associates changes caused by the state machine with the respective visual elements. In receiving the visual command model 112b, the client device 102 may receive a model that associates visual elements with known commands that may affect state machine behavior. In receiving the visual interaction model 112c, the client device 102 may receive a model that may identify specific visual elements and a set of gestures that they made accept. For example, the client device 102 may receive a model that indicates what a user may do to the visual model. In one or more examples, in receiving the state machine model information, the client device 102 may receive visual model interface information that may be used to generate a visual model corresponding to each of one or more state machine models.

At step 224, the client device 102 may use the state machine model information to generate one or more visual model interfaces. For example, the client device 102 may use visual model interface information included in the state machine model information to generate a visual model corresponding to each device identification input received at step 210. In causing display of the visual interface models, the client device 102 may cause display of a graphical user interface. One example of an illustrative graphical user interface is graphical user interface 405, which is illustrated in FIG. 4. As seen in FIG. 4, graphical user interface 405 may include a virtual model of a device, such as a thermostat. This example may be for a situation where the device identifier entered by a user (e.g., in steps 209 and 210 and via the interface illustrated in FIG. 3) is a thermostat. In one or more examples, the virtual model may be displayed within a virtual reality environment, and a user may be able to interact with the thermostat. For example, the simulation may allow the user to adjust a current temperature by entering a gesture input that translates to pushing either the temperature increase button or the temperature decrease button.

At step 225, the client device 102 may receive an interaction input (e.g., via a graphical user interface, as described above in connection with FIG. 4). For example, the client device 102 may receive a gesture input corresponding to an interaction with a visual model interface generated at step 224. For example, the client device 102 may receive a gesture input in which a user engaged in a virtual reality environment reaches out and presses a button of visual model depicted on the visual model interface generated at step 224. As another example, in a non-virtual-reality environment, the user may provide an input using a mouse, keyboard, touchscreen, or the like.

Referring to FIG. 2F, at step 226, the client device 102 may determine a virtual interaction corresponding to the interaction input. For example, the client device 102 may determine that by reaching out to a particular location, the user is attempting to press a button on the visual model. As an example, the client device 102 may determine that the user is attempting to press the decrease temperature button depicted on graphical user interface 405. In one or more examples, the client device 102 may use the visual interaction model 112c to map the interaction input received at step 225 to a virtual interaction (e.g., map a physical hand gesture to pressing a button in the virtual environment).

At step 227, after determining the virtual interaction at step 226, the client device may send a virtual interaction indication to the state machine execution platform 103 indicating that a user has interacted with the visual model, and that a state change of the visual model may be requested. For example, if the visual model is of a thermostat, the client device 102 may indicate that an updated temperature should be displayed on the visual model of the thermostat in response to the user requesting to decrease the temperature. In one or more examples, the client device 102 may send the virtual interaction indication to the state machine execution platform 103 using the visual command model 112b. In sending the virtual interaction indication, the client device 102 may send, while the second wireless data connection is established and via the communication interface 113, the virtual interaction indication.

At step 228, the state machine execution platform 103 may receive the virtual interaction indication sent at step 227. For example, the state machine execution platform 103 may receive the virtual interaction indication while the second wireless data connection is established and via the communication interface 116. In one or more examples, the state machine execution platform 103 may receive the virtual interaction indication at the command model 117b. If the state machine execution platform 103 determines that an update to the visual model should be implemented, the state machine execution platform 103 may proceed to step 229. If the state machine execution platform 103 determines that an update to the visual model should not be implemented, the state machine execution platform 103 may proceed to step 233.

At step 229, the state machine execution platform 103 may cause a state change of the visual model corresponding to the virtual interaction indication. For example, the state machine execution platform 103 may cause the command model 117b to direct the state change model 117a to cause an update to the state machine model 117. For example, if the virtual model is of a thermostat, the command model 117b may direct the state change model 117a to generate state change information that the client device 102 may use to adjust the current temperature displayed on the thermostat, and the state change model 117a may generate the state change information in response.

At step 230, state machine execution platform 103 may send the state change information generated at step 229. For example, the state machine execution platform 103 may use the state change model 117a to send the state change information. In sending the state change information, the state machine execution platform 103 may send the state change information via the communication interface 116 and while the second wireless data connection is established.

At step 231, the client device 102 may receive the state change information sent at step 230. In one or more examples, the client device 102 may receive the state change information at the visual state change model 112a. For example, the client device 102 may receive, while the second wireless data connection is established and via the communication interface 113, the state change information.

Figure 2G:
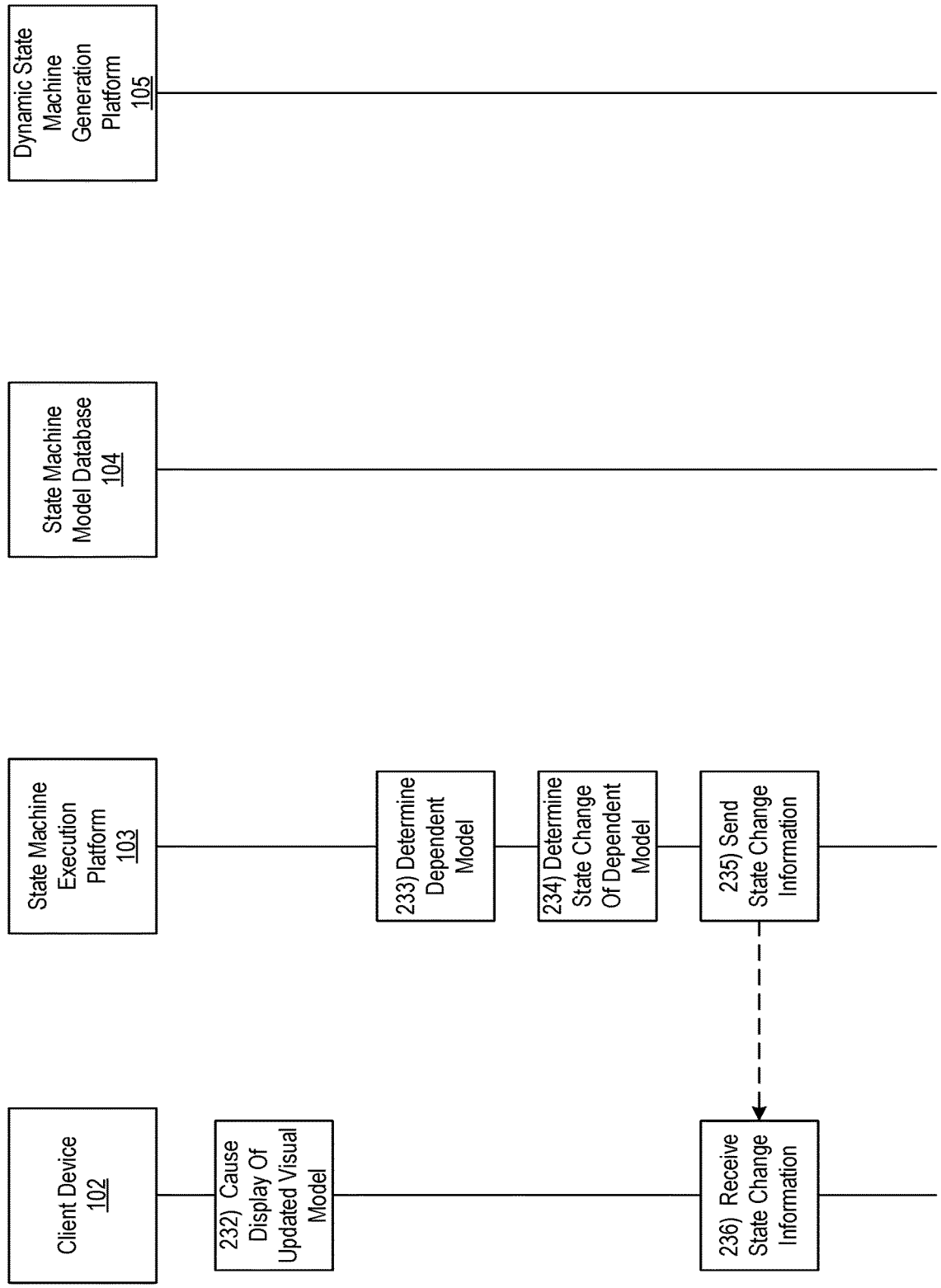
Figure 5:
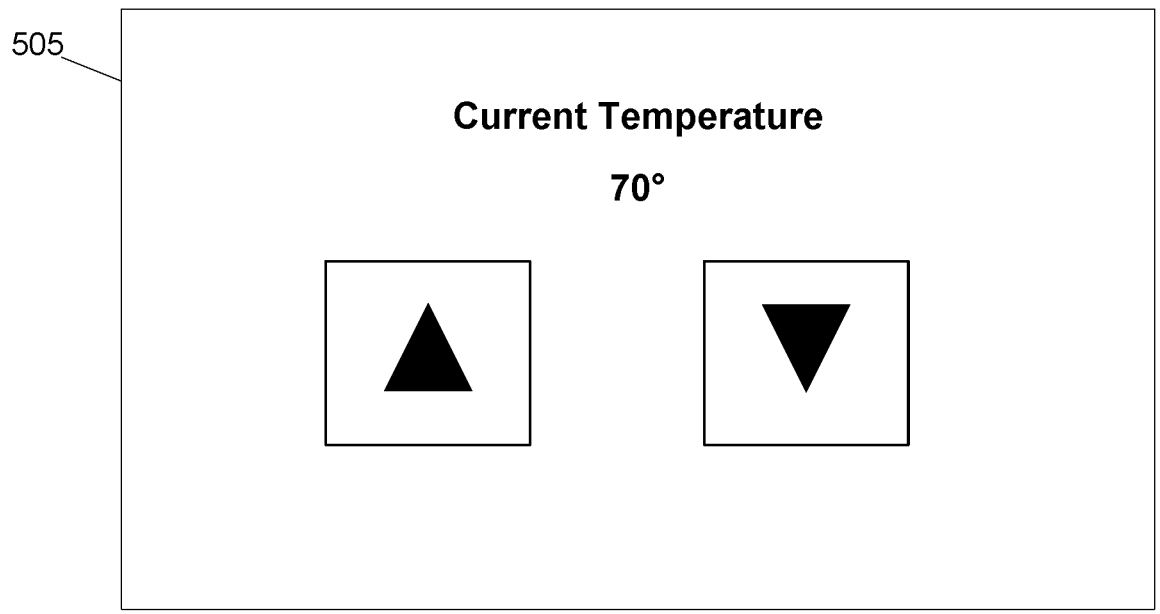

Referring to FIG. 2G, at step 232, the client device 102 may cause display of an updated visual model using the state change information received at step 231. For example, the client device 102 may use the visual state change model 112a to cause display of the updated visual model. In one or more examples, the updated visual model may reflect the interaction input received at the client device 102 at step 225. In causing display of the updated visual model, the client device 102 may cause display of a graphical user interface similar to graphical user interface 505, which is illustrated in FIG. 5. As seen in FIG. 5, graphical user interface 505 may include an updated thermostat display that reflects decrease in the temperature caused by the user's interaction with the thermostat.

At step 233, the state machine execution platform 103 may determine whether any of the one or more state machine models depend from state machine model 117. For example, the state machine execution platform 103 may determine whether an update to any other visual models included in the virtual environment displayed by the client device 102 should be updated in response to the updated visual model generated at step 232. For example, if the virtual model is of a thermostat, the state machine execution platform 103 may determine that if the temperature of a thermostat is decreased, air flow should be shown coming from a heating, ventilation, and air conditioning (HVAC) system that may also be displayed in the virtual environment, and thus the visual model corresponding to the HVAC system should be updated. The state machine execution platform 103 may determine whether any of the one or more state machine models depend from the state machine model 117 by consulting the dependency model 117d. For example, the state machine execution platform 103 may determine device identifiers of other devices that depend on the device corresponding to the state machine model 117, and thus should have an update to their visual models implemented at the client device 102.

At step 234, the state machine execution platform 103 may determine the state change of the dependent state machine models determined at step 233. For example, the state machine execution platform 103 may index the device identifiers determined at step 233 in the interface model 117c to determine how the dependent state machine models interact with the state machine model 117 and whether an update to the visual models corresponding to the dependent state machine models should be implemented. For example, as described above with regard to step 233, the state machine execution platform 103 may determine that a visual model corresponding to an HVAC system should be updated to depict air flow from a vent in response to a decrease in temperature on the thermostat model. If the state machine execution platform 103 determines that an update should be implemented, the state machine execution platform 103 may proceed to step 235. If the state machine execution platform 103 determines that an update should not be implemented, the event sequence may end.

At step 235, the state machine execution platform 103 may send dependent model state change information corresponding to the state change, determined at step 234, to the client device 102. For example, the state machine execution platform 103 may send, while the second wireless data connection is established and via the communication interface 116, the dependent model state change information.

At step 236, the client device 102 may receive the dependent model state change information sent at step 235. For example, the client device 102 may receive the dependent model state change information via the communication interface 113 and while the second wireless data connection is still established.

Referring to FIG. 2H, at step 237, the client device 102 may generate and cause display of an updated visual model for the dependent models corresponding to the dependent model state change information. For example, the client device 102 may cause visual modifications corresponding to the dependent models to be displayed in the virtual environment shown by the client device 102. At this point, a user may continue to interact with the updated visual model, which may result in further updated visual models. In one or more instances, the user may interact with the visual model for technical training and/or to test capabilities of a device.

At step 238, after simulating the device, the client device 102 may receive a verification input corresponding to the device. In some instances, the verification input may correspond to user input indicating that the simulated performance of the device was acceptable and/or within predetermined parameters corresponding to the device (e.g., temperatures, flow rates, output power, or the like).

At step 239, the client device 102 may send verification information to the state machine execution platform 103. In one or more examples, the client device 102 may send the verification information to the state machine execution platform 103 while the second wireless data connection is established and via the communication interface 113. In these examples, the client device 102 may send information indicating that the simulated performance of the device was within the predetermined parameters corresponding to the device.

At step 240, the state machine execution platform 103 may receive the verification information sent at step 239. In one or more examples, the state machine execution platform 103 may receive the verification information while the second wireless data connection is established and via the communication interface 116.

At step 241, the state machine execution platform 103 may cause the device to be implemented under the simulated conditions. In one or more examples, the state machine execution platform 103 may establish a connection with the device. The state machine execution platform 103 may generate one or more commands directing the device to perform as simulated using the models described above. For example, the state machine execution platform 103 may generate one or more commands directing a valve control system to operate a valve, after simulating the valve using the models discussed, at a particular flow rate. In this example, the particular flow rate may have been simulated, and performance of the valve at the particular flow rate may have been verified at step 238. In another example, the state machine execution platform 103 may cause a device to operate at the simulated level, rate, speed, or the like after determining that the temperature of the device, under the simulated operating conditions, is within a predetermined temperature range for the device. After receiving a verification input corresponding to the device, the state machine execution platform 103 may generate one or more commands directing the device to modify its operating conditions based on the simulated conditions, and may send the one or more commands to the device. This may cause the device to adjust operation settings and to initiate operation under the simulated conditions.

Figure 6:
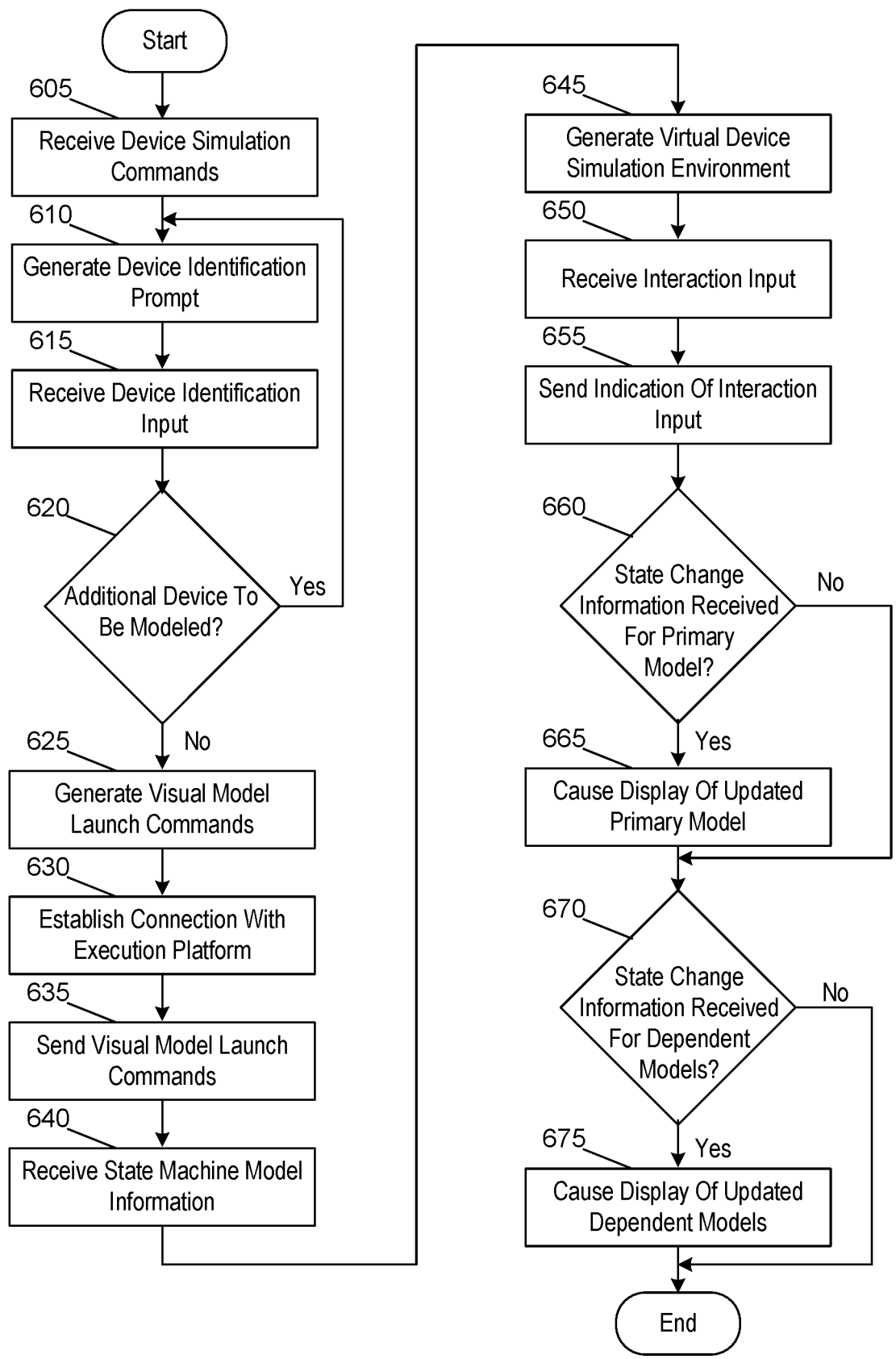
FIGS. 6 and 7 depict illustrative methods for deploying a model based processing system for performing improved virtual device simulation and programming techniques in accordance with one or more example embodiments.

FIG. 6 depicts an illustrative method for deploying a model-based processing system for performing improved virtual device simulation and programming techniques in accordance with one or more example embodiments. Referring to FIG. 6, at step 605, a computing platform, having at least one processor, a communication interface, and memory may receive one or more commands directing the computing platform to cause display of a virtual device simulation environment. At step 610, the computing platform may prompt for a device identification input to identify a device that should be included in the virtual device simulation environment. At step 615, the computing platform may receive the device identification input. At step 620, the computing platform may determine whether an additional device should be modeled in the virtual device simulation environment. If the computing platform determines that an additional device should be modeled in the virtual device simulation environment, the computing platform may return to step 610. If the computing platform determines that an additional device should not be modeled in the virtual device simulation environment, the computing platform may proceed to step 625.

At step 625, the computing platform may generate one or more commands directing a state machine execution platform to launch visual models corresponding to the device identification inputs received. At step 630, the computing platform may establish a connection with the state machine execution platform. At step 635, the computing platform may send, to the state machine execution platform, one or more commands directing the state machine execution platform to launch visual models corresponding to the device identification inputs received. At step 640, the computing platform may receive, from the state machine execution platform and in response to one or more commands directing the state machine execution platform to launch visual models corresponding to the device identification inputs received, state machine model information. At step 645, the computing platform may generate, using the state machine model information, a virtual device simulation environment that includes one or more visual models corresponding to the device identification inputs received. At step 650, the computing platform may receive an interaction input corresponding to a virtual interaction with one of the visual models. At step 655, the computing platform may send an indication of the interaction input to the state machine execution platform. At step 660, the computing platform may determine whether state change information was received for the one of the visual models. If the computing platform determines that state change information was received for one of the visual models, the computing platform may proceed to step 665. If the computing platform determines that state change information was not received for one of the visual models, the computing platform may proceed to step 670.

At step 665, the computing platform may cause display of an updated model corresponding to one of the visual models updated based on the state change information. At step 670, the computing platform may determine whether state change information was received corresponding to a dependent visual model. If the computing platform determines that state change information was received for a dependent visual model, the computing platform may proceed to step 675. If the computing platform determines that state change information was not received for a dependent visual model, the method may end. At step 675, the computing platform may cause display of an updated dependent model corresponding to the dependent visual model updated based on the state change information.

Figure 7:
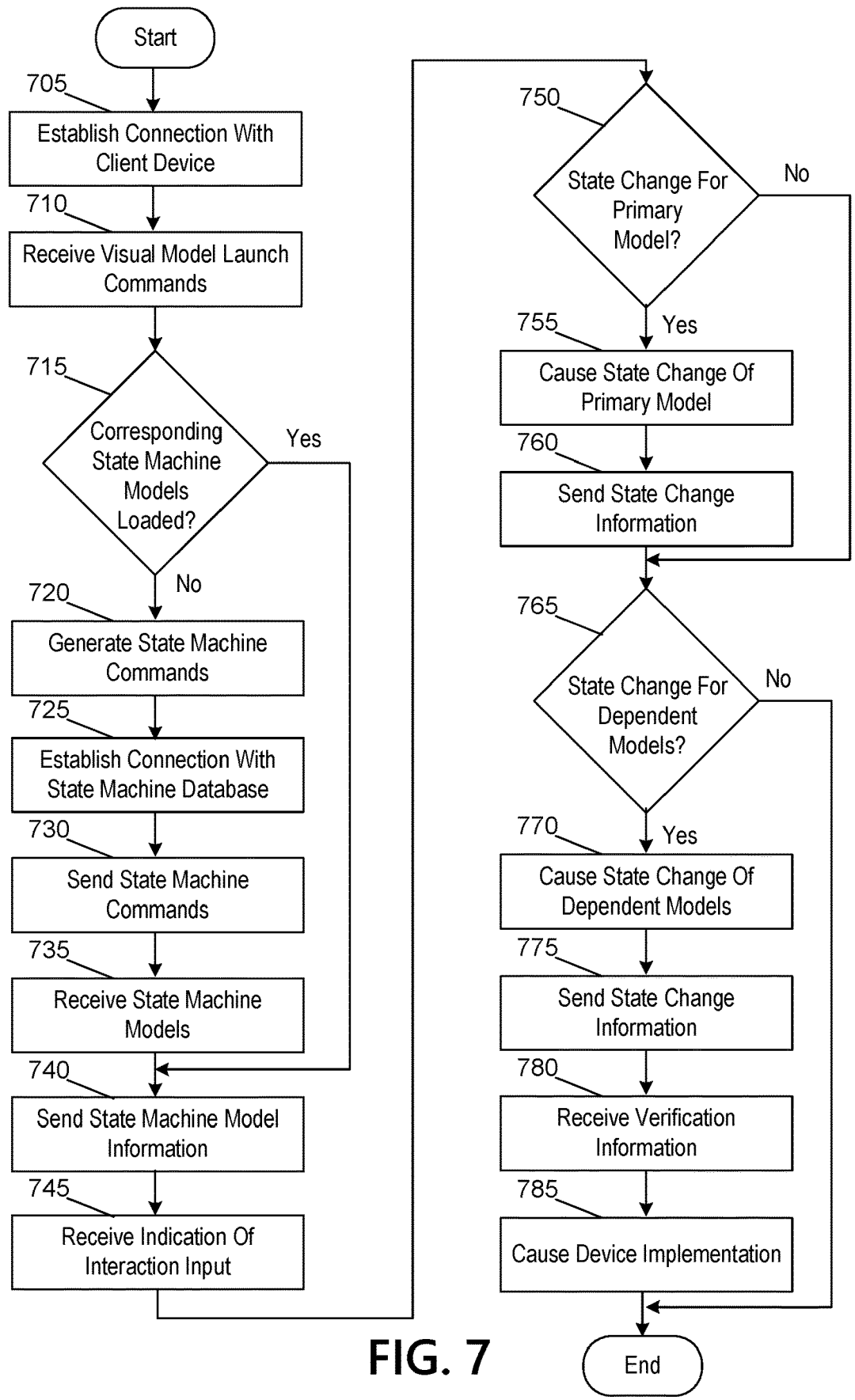

FIG. 7 depicts an illustrative method for deploying a model-based processing system for performing improved virtual device simulation and programming techniques in accordance with one or more example embodiments. Referring to FIG. 7, at step 705, a computing platform, having at least one processor, a communication interface, and memory may establish a connection with a client device. At step 710, the computing platform may receive one or more commands directing the computing platform to launch one or more visual models. At step 715, the computing platform may determine whether the state machine models corresponding to one or more visual models are loaded at the computing platform. If the computing platform determined that one or more state machine models are loaded, the computing platform may proceed to step 740. If the computing platform determines that one or more state machine models are not loaded, the computing platform may proceed to step 720.

At step 720, the computing platform may generate one or more commands directing a state machine model database to provide the state machine models corresponding to one or more visual models. At step 725, the computing platform may establish a wireless data connection with the state machine model database. At step 730, the computing platform may send one or more commands directing the state machine model database to provide the state machine models corresponding to one or more visual models. At step 735, the computing platform may receive the state machine models corresponding to one or more visual models. At step 740 the computing platform may send state machine model information to the client device that may be used by the client device to cause display of one or more visual models. At step 745, the computing platform may receive an indication of an interaction input. At step 750, the computing platform may determine whether a state change should be implemented for a primary model corresponding to the interaction input. If the computing platform determines that a state change should be implemented, the computing platform may proceed to step 755. If the computing platform determines that a state change should not be implemented, the computing platform may proceed to step 765.

At step 755, the computing platform may cause the state change of the primary model. At step 760, the computing platform may send state change information to the client device that may be used to generate an updated visual model based on the state change of the primary model. At step 765, the computing platform may determine whether a state change should be implemented for a dependent model. If the computing platform determines that a state change should not be implemented for a dependent model, the event sequence may end. If the computing platform determines that a state change should be implemented for a dependent model, the computing platform may proceed to step 770.

At step 770, the computing platform may cause the state change for the dependent model. At step 775, the computing platform may send dependent state change information that may allow the client device to generate an updated visual model based on the state change of the dependent model. At step 780, the computing platform may receive verification information indicating that the simulated device operated within predetermined parameters during simulation. At step 785, the computing platform may cause the device to be implemented and/or may cause an update in operating conditions of the device based on the verification information.

One or more aspects of the disclosure may be embodied in computer-usable data or computer-executable instructions, such as in one or more program modules, executed by one or more computers or other devices to perform the operations described herein. Generally, program modules include routines, programs, objects, components, data structures, and the like that perform particular tasks or implement particular abstract data types when executed by one or more processors in a computer or other data processing device. The computer-executable instructions may be stored as computer-readable instructions on a computer-readable medium such as a hard disk, optical disk, removable storage media, solid-state memory, RAM, and the like. The functionality of the program modules may be combined or distributed as desired in various embodiments. In addition, the functionality may be embodied in whole or in part in firmware or hardware equivalents, such as integrated circuits, application-specific integrated circuits (ASICs), field programmable gate arrays (FPGA), and the like. Particular data structures may be used to more effectively implement one or more aspects of the disclosure, and such data structures are contemplated to be within the scope of computer executable instructions and computer-usable data described herein.

Various aspects described herein may be embodied as a method, an apparatus, or as one or more computer-readable media storing computer-executable instructions. Accordingly, those aspects may take the form of an entirely hardware embodiment, an entirely software embodiment, an entirely firmware embodiment, or an embodiment combining software, hardware, and firmware aspects in any combination. In addition, various signals representing data or events as described herein may be transferred between a source and a destination in the form of light or electromagnetic waves traveling through signal-conducting media such as metal wires, optical fibers, or wireless transmission media (e.g., air or space). In general, the one or more computer-readable media may be and/or include one or more non-transitory computer-readable media.

As described herein, the various methods and acts may be operative across one or more computing servers and one or more networks. The functionality may be distributed in any manner, or may be located in a single computing device (e.g., a server, a client computer, and the like). For example, in alternative embodiments, one or more of the computing platforms discussed above may be combined into a single computing platform, and the various functions of each computing platform may be performed by the single computing platform. In such arrangements, any and/or all of the above-discussed communications between computing platforms may correspond to data being accessed, moved, modified, updated, and/or otherwise used by the single computing platform. Additionally, or alternatively, one or more of the computing platforms discussed above may be implemented in one or more virtual machines that are provided by one or more physical computing devices. In such arrangements, the various functions of each computing platform may be performed by the one or more virtual machines, and any and/or all of the above-discussed communications between computing platforms may correspond to data being accessed, moved, modified, updated, and/or otherwise used by the one or more virtual machines.

Aspects of the disclosure have been described in terms of illustrative embodiments thereof. Numerous other embodiments, modifications, and variations within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

What is claimed is:

1. A computing platform, comprising:
    at least one processor;
    a communication interface commutatively coupled to the at least one processor; and
    memory storing computer-readable instructions that, when executed by the at least one processor, cause the computing platform to:
        receive one or more commands directing the computing platform to launch a visual model corresponding to at least one device using a device identifier, the device identifier including information associated to the at least one device received from a client device;

generate, using the client device, a device identifier prompt including at least one user interface requesting user input for the at least one device corresponding to the device identifier, wherein the client device continues to prompt for the device identifiers for at least one of a predetermined period of time lapsed or until a determination is made that additional visual models is requested, for which the visual model is added to a virtual environment, and wherein the at least one user interface includes a list of device identifiers that the user has already entered to remind the user for the device identifiers that the user has already entered previously;

send one or more commands directing a state machine model database to provide a state machine model corresponding to the visual model;

receive the state machine model corresponding to the visual model;

receive, from the client device, an indication of a virtual interaction with the visual model;

cause a state change of the visual model based on the indication of the virtual interaction, wherein the client device is further configured to:
receive a client execution framework that interface with one or more state machine models,
receive a visual state change model, a visual command model, and a visual interaction model that is used to cause visual updates to the visual model based on the virtual interaction, and
receive a model that associates changes caused by the state machine with the respective visual element which are associates with known commands that provide state machine behavior; and send, to the client device, state change information corresponding to the visual model.

2. The computing platform of claim 1, wherein the computer-readable instructions, when executed by the at least one processor, cause the computing platform to:
establish a first wireless data connection with the client device; and
establish a second wireless data connection with the state machine model database.

3. The computing platform of claim 1, wherein the computer-readable instructions, when executed by the at least one processor, cause the computing platform to:
determine additional state machine models that are dependent on the state machine model;
determine, using a stored interface model and for each of the additional state machine models that are dependent on the state machine model, a state change; and
send, to the client device, an indication of the state change for each of the additional state machine models that are dependent on the state machine model.

4. The computing platform of claim 3, wherein the computer-readable instructions, when executed by the at least one processor, cause the computing platform to determine the additional state machine models that are dependent on the state machine model by determining additional device identifiers stored in a dependency model of the state machine model.

5. The computing platform of claim 1, wherein the state machine model comprises one of a plurality of state machine models stored by the state machine model database, each state machine model of the plurality of state machine models corresponding to a different device identifier, and each state machine model of the plurality of state machine models stored at the state machine model database before receiving the one or more commands to launch the visual model corresponding to the device identifier.

6. The computing platform of claim 1, wherein the visual model comprises an element of one of an augmented reality environment, mixed-reality or a virtual reality environment.

7. The computing platform of claim 1, wherein causing the state change of the visual model based on the indication of the virtual interaction comprises determining that one or more visible attributes of the visual model should be modified in response to the virtual interaction, and wherein the virtual interaction comprises a gesture input corresponding to the visual model.

8. A method comprising:
at a computing platform comprising at least one processor, a communication interface, and memory:
receive one or more commands directing the computing platform to launch a visual model corresponding to at least one device using a device identifier, the device identifier including information associated to the at least one device received from a client device;
generate, using the client device, a device identifier prompt including at least one user interface requesting user input for the at least one device corresponding to the device identifier, wherein the client device continues to prompt for the device identifiers for at least one of a predetermined period of time lapsed or until a determination is made that additional visual models is requested, for which the visual model is added to a virtual environment, and wherein the at least one user interface includes a list of device identifiers that the user has already entered to remind the user for the device identifiers that the user has already entered previously;
send one or more commands directing a state machine model database to provide a state machine model corresponding to the visual model;
receive the state machine model corresponding to the visual model;
receive, from the client device, an indication of a virtual interaction with the visual model;
cause a state change of the visual model based on the indication of the virtual interaction, wherein the client device is further configured to:
receive a client execution framework that interface with one or more state machine models,
receive a visual state change model, a visual command model, and a visual interaction model that is used to cause visual updates to the visual model based on the virtual interaction, and
receive a model that associates changes caused by the state machine with the respective visual element which are associates with known commands that provide state machine behavior; and
send, to the client device, state change information corresponding to the visual model.

9. The method of claim 8, further comprising:
establishing a first wireless data connection with the client device; and
establishing a second wireless data connection with the state machine model database.

10. The method of claim 8, further comprising:
determining additional state machine models that are dependent on the state machine model;

determining, using a stored interface model and for each of the additional state machine models that are dependent on the state machine model, a state change; and sending, to the client device, an indication of the state change for each of the additional state machine models that are dependent on the state machine model.

11. The method of claim 10, further comprising determining the additional state machine models that are dependent on the state machine model by determining additional device identifiers stored in a dependency model of the state machine model.

12. The method of claim 8, wherein the state machine model comprises one of a plurality of state machine models stored by the state machine model database, each state machine model of the plurality of state machine models corresponding to a different device identifier, and each state machine model of the plurality of state machine models stored at the state machine model database prior to receiving the one or more commands to launch the visual model corresponding to the device identifier.

13. The method of claim 8, wherein the visual model comprises an element of one of an augmented reality environment, a mixed-reality environment or a virtual reality environment.

14. The method of claim 8, wherein causing the state change of the visual model based on the indication of the virtual interaction comprises determining that one or more visible attributes of the visual model should be modified in response to the virtual interaction, and wherein the virtual interaction comprises a gesture input corresponding to the visual model.

15. One or more non-transitory computer-readable media storing instructions that, when executed by a computing platform comprising at least one processor, a communication interface, and memory, cause the computing platform to:
receive one or more commands directing the computing platform to launch a visual model corresponding to at least one device using a device identifier, the device identifier including information associated to the at least one device received from a client device;
generate, using the client device, a device identifier prompt including at least one user interface requesting user input for the at least one device corresponding to the device identifier, wherein the client device continues to prompt for the device identifiers for at least one of a predetermined period of time lapsed or until a determination is made that additional visual models is requested, for which the visual model is added to a virtual environment, and wherein the at least one user interface includes a list of device identifiers that the user has already entered to remind the user for the device identifiers that the user has already entered previously;
send one or more commands directing a state machine model database to provide a state machine model corresponding to the visual model;
receive the state machine model corresponding to the visual model;
receive, from the client device, an indication of a virtual interaction with the visual model;
cause a state change of the visual model based on the indication of the virtual interaction, wherein the client device is further configured to:
receive a client execution framework that interface with one or more state machine models,
receive a visual state change model, a visual command model, and a visual interaction model that is used to cause visual updates to the visual model based on the virtual interaction, and
receive a model that associates changes caused by the state machine with the respective visual element which are associates with known commands that provide state machine behavior; and
send, to the client device, state change information corresponding to the visual model.

16. The one or more non-transitory computer-readable media of claim 15, wherein the instructions, when executed by the at least one processor, cause the computing platform to establish a first wireless data connection with the client device and to establish a second wireless data connection with the state machine model database.

17. The one or more non-transitory computer-readable media of claim 15, wherein the instructions, when executed by the at least one processor, cause the computing platform to:
determine additional state machine models that are dependent on the state machine model;
determine, using a stored interface model and for each of the additional state machine models that are dependent on the state machine model, a state change; and
send, to the client device, an indication of the state change for each of the additional state machine models that are dependent on the state machine model.

18. The one or more non-transitory computer-readable media of claim 17, wherein the instructions, when executed by the at least one processor, cause the computing platform to determine the additional state machine models that are dependent on the state machine model by determining additional device identifiers stored in a dependency model of the state machine model.

19. The one or more non-transitory computer-readable media of claim 15, wherein the state machine model comprises one of a plurality of state machine models stored by the state machine model database, each state machine model of the plurality of state machine models corresponding to a different device identifier, and each state machine model of the plurality of state machine models stored at the state machine model database prior to receiving the one or more commands to launch the visual model corresponding to the device identifier.

20. The one or more non-transitory computer-readable media of claim 15, wherein causing the state change of the visual model based on the indication of the virtual interaction comprises determining that one or more visible attributes of the visual model should be modified in response to the virtual interaction, and wherein the virtual interaction comprises a gesture input corresponding to the visual model.

* * * * *